United States Patent [19]

Jeffries, III et al.

[11] Patent Number: 5,278,021
[45] Date of Patent: Jan. 11, 1994

[54] O-NAPHTHOQUINONE DIAZIDE SULFONYL ESTERS OF 4-(4-HYDROXYPHENYL)CYCLOHEXANONE PHENOLIC DERIVATIVES WITH ASSOCIATED RADIATION SENSITIVE MIXTURES AND ARTICLES

[75] Inventors: Alfred T. Jeffries, III, Providence; Medhat A. Toukhy, Barrington, both of R.I.

[73] Assignee: OCG Microelectronic Materials, Inc., West Paterson, N.J.

[21] Appl. No.: 45,022

[22] Filed: Apr. 5, 1993

[51] Int. Cl.$^5$ .................. G03F 7/023; G03F 7/09
[52] U.S. Cl. .................. 430/165; 430/191;
430/192; 430/193; 430/272; 430/275; 430/277;
430/278; 534/557
[58] Field of Search .......... 534/557; 430/191, 193,
430/192, 165, 272, 275, 277, 278

[56] References Cited

U.S. PATENT DOCUMENTS 5,010,163 4/1991 Serini et al. .................. 528/204
5,112,719 5/1992 Yamada et al. .................. 430/193

FOREIGN PATENT DOCUMENTS 3-291250 12/1991 Japan .
4-012356 1/1992 Japan .

*Primary Examiner*—Richard L. Schilling
*Assistant Examiner*—Christopher G. Young
*Attorney, Agent, or Firm*—William A. Simons

[57] ABSTRACT

A radiation sensitive mixture comprising an alkali-soluble binder resin and at least one photoactive compound comprising a compound of formula (I):

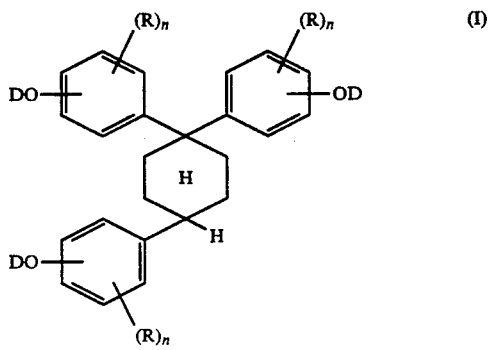

wherein each R is individually selected from hydrogen and a lower alkyl group having 1 to 4 carbon atoms; n is either 0, 1, or 2; and D is selected from the group consisting of hydrogen or o-naphthoquinone diazide sulfonyl group; with the proviso that at least two D's are o-naphthoquinone diazide sulfonyl groups, and wherein the amount of said binder resin is about 70 to 95% by weight and the amount of photoactive compound being from about 5 to about 30% be weight, based on the total solids content of said content of said raditional-sensitive mixture.

10 Claims, No Drawings

O-NAPHTHOQUINONE DIAZIDE SULFONYL ESTERS OF 4-(4-HYDROXYPHENYL)CYCLOHEXANONE PHENOLIC DERIVATIVES WITH ASSOCIATED RADIATION SENSITIVE MIXTURES AND ARTICLES

BACKGROUND OF THE INVENTION

1. Field of the Invention

The present invention relates to selected phenolic derivatives of 4-(4-hydroxyphenyl)cyclohexanone useful as backbones for certain photoactive compounds. Further, the present invention relates to such photoactive compounds formed by the esterification of these phenolic derivatives of 4-(4-hydroxyphenyl)cyclohexanone with sulfonyl halides of o-naphthoquinone diazides. Still further, the present invention also relates to radiation sensitive mixtures (e.g., those particularly useful as positive-working photoresists) containing the combination of these photoactive compounds with alkali-soluble binder resins dissolved in a solvent. And furthermore, the present invention also relates to substrates coated with these radiation sensitive mixtures as well as the process of coating, imaging and developing these radiation sensitive mixtures on these substrates.

2. Description of the Related Art Including Information Disclosed under 37 CFR §§ 1.97-1.98

Photoresist compositions are used in microlithographic processes for making miniaturized electronic components such as in the fabrication of integrated circuits and printed wiring board circuitry. In these processes, a thin coating or film of a photoresist composition is generally first applied to a substrate material, such as silicon wafers used for making integrated circuits or aluminum or copper plates of printed wiring boards. The coated substrate is then baked to evaporate any solvent in the photoresist composition and to fix the coating onto the substrate. The baked coated surface of the substrate is next subjected to an image-wise exposure of radiation. This radiation exposure causes a chemical transformation in the exposed areas of the coated surface. Visible light, ultraviolet (UV) light, electron beam, ion beam and X-ray radiant energy are radiation types commonly used today in microlithographic processes.

After this image-wise exposure, the coated substrate is treated with a developer solution to dissolve and remove either the radiation-exposed or the unexposed areas of the coated surface of the substrate. In some processes, it is desirable to bake the imaged resist coating before this developing step. This intermediate step is sometimes called post-exposure bake or PEB.

There are two types of photoresist compositions—negative-working and positive-working. When negative-working photoresist compositions are exposed image-wise to radiation, the areas of the resist composition exposed to the radiation become less soluble to a developer solution (e.g., a cross-linking reaction occurs) while the unexposed areas of the photoresist coating remain relatively soluble to a developing solution. Thus, treatment of an exposed negative-working resist with a developer solution causes removal of the nonexposed areas of the resist coating and the creation of a negative image in the photoresist coating, and thereby uncovering a desired portion of the underlying substrate surface on which the photoresist composition was deposited. On the other hand, when positive-working photoresist compositions are exposed image-wise to radiation, those areas of the resist composition exposed to the radiation become more soluble to the developer solution (e.g., the Wolff rearrangement reaction of the photoactive compound occurs) while those areas not exposed remain relatively insoluble to the developer solution. Thus, treatment of an exposed positive-working resist with the developer solution causes removal of the exposed areas of the resist coating and the creation of a positive image in the photoresist coating. Again, a desired portion of the underlying substrate surface is uncovered.

Positive-working photoresist compositions are currently favored over negative-working resists because the former generally have better resolution capabilities and pattern transfer characteristics.

After this development operation, the now partially unprotected substrate may be treated with a substrate etchant solution or plasma gases and the like. This etchant solution or plasma gases etch the portion of the substrate where the photoresist coating was removed during development. The areas of the substrate are protected where the photoresist coating still remains and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining resist layer after the development step and before the etching step to increase its adhesion to the underlying substrate and its resistance to etching solutions.

End users of photoresists are demanding photoresist formulations which possess better lithographic properties for the fabrication of smaller microelectronic circuits. The lithographic properties which are critical to these end-users include the following: (1) resolution capabilities in both the micron and submicron ranges without incomplete development in the exposed areas (i.e., scumming); (2) higher thermal image deformation temperatures (e.g. above 120° C.); (3) relatively fast photospeeds; (4) good adhesion to substrate; (5) good developer dissolution rates; (6) wide process latitude; (7) near to absolute vertical profiles (or good contrast) between exposed and unexposed photoresist areas after development; (8) good resistance to etching solutions and plasma etching techniques; (9) reduced tendency to form insoluble particulates; (10) mask linearity; and (11) low metal contamination.

Generally, in the past efforts to improve one of these lithographic properties have caused significant decreases in one or more of the other lithographic properties of the photoresist. Accordingly, there is a need for improved photoresist formulations which possess all of these desired properties. The present invention is believed to be an answer to that need.

For example, while photoactive compounds are essential to obtain the positive images of positive-working photoresists, such photoactive compounds are sometimes not soluble for extended time periods in photoresist formulations. They may also contribute to the degradation of photoresist formulations by chemical reaction. Still further, certain photoactive compounds may contribute to scumming, causing the degradation of the thermal profile, and contributing to the lowering of the thermal deformation temperature of the resist patterns.

Selection of a suitable photoactive compound without those weaknesses is a difficult and not a totally predictable task.

Separately, Japanese Patent Publication (Kokai) No. 3-291250, which was published on Dec. 20, 1991, teaches a phenolic compound defined by the structure of formula (PA-1):

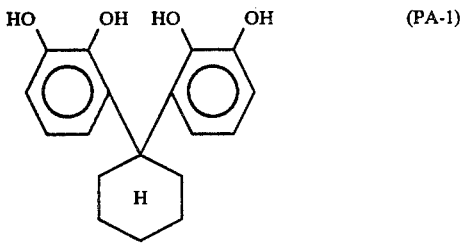

This Kokai also teaches that positive photoresist compositions may be made which contain photoactive compounds made of the ester of compound (PA-1) with a quinonediazidesulfonate. The reference suggests that these photoresist compositions provide high gamma values without an increase in residues in development.

Also, Japanese Patent Publication (Kokai) No. 4-012356, which was published on Jan. 16, 1992, teaches a positive-working photoresist composition containing a novolak resin, a quinonediazide compound, and a polyhydric phenolic compound having the structure of formula (PA-2):

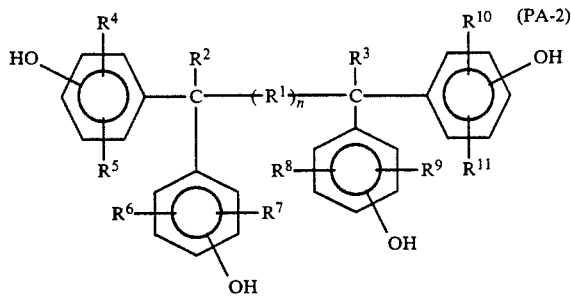

wherein $R^1$ is a bifunctional hydrocarbon, n is 0 or 1, $R^2$ and $R^3$ are selected from hydrogen, alkyl, aryl, or aralkyl group; $R^2$ and $R^3$ are optionally combined to form a cyclic structure; $R^4$, $R^5$, $R^6$, $R^7$, $R^8$, $R^9$, and $R^{11}$ are selected from hydrogen, halogen, hydroxyl, or an alkyl group. This Kokai suggests that these positive photoresist compositions possess high photosensitivity and are useful for high density integrated circuit fabrication.

One polyhydric phenolic compound encompassed by the above formula (PA-2) is the following compound (PA-2a):

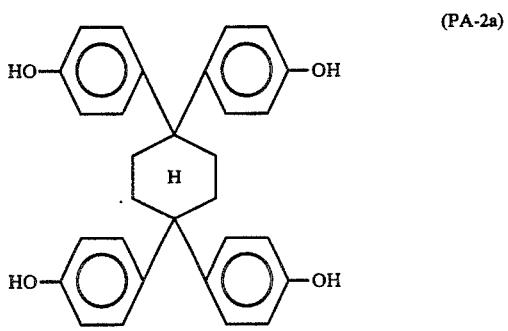

SUMMARY OF THE INVENTION

Moreover, the present invention is directed to photoactive o-naphthoquinone diazide sulfonyl moieties of said phenolic derivatives of 4-(4-hydroxyphenyl)cyclohexanone having formula (I):

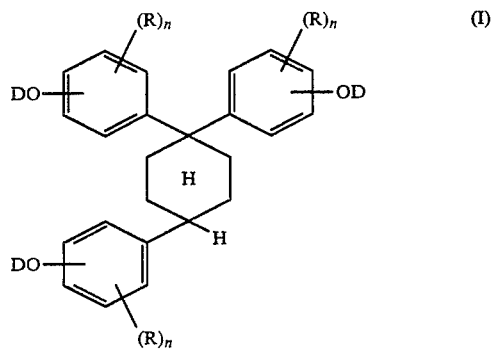

wherein each R is individually selected from the group consisting of hydrogen and lower alkyl group having 1–4 carbon atoms and each n is 0, 1, or 2; and wherein each D is an o-naphthoquinone diazide sulfonyl moiety or a hydrogen atom, with the proviso at least two D's. are o-naphthoquinone diazide sulfonyl moieties.

Moreover, the present invention is directed to a radiation sensitive mixture useful as a positive photoresist comprising an admixture of at least one photoactive o-naphthoquinone diazide compound of formula (II) above and an alkali-soluble binder resin; the amount of said photoactive o-naphthoquinone diazide compound or compounds being about 5% to about 30% by weight and the amount of said binder resin being about 70% to 95% by weight, based on the total solids content of said radiation sensitive mixture.

Still further, the present invention also encompasses the process of coating substrates with these radiation sensitive mixtures and then exposing and developing these coated substrates.

Also further, the present invention encompasses said coated substrates (both before and after imaging) as novel articles of manufacture.

DESCRIPTION OF PREFERRED EMBODIMENTS

The selected phenolic derivatives of 4-(4-hydroxyphenyl)cyclohexanone are made by reacting 4-(4-hydroxyphenyl)cyclohexanone with phenol in the presence of an acid. The major product of this reaction is 1,1,4-tris(trihydroxyphenol)cyclohexane. The lower alkyl-substituted homologs of this compound may be made with using various cresol precursors.

The triphenolcyclohexane compounds of this invention may be converted into the photoactive compounds (PAC's) of formula (I) by their condensation with o-naphthoquinone diazide sulfonyl compounds. Any o-naphthoquinone diazide sulfonyl compound used in making photoresist sensitizers may be employed herein. The most preferred o-naphthoquinone diazide sulfonyl ester moieties are derived from 3-diazo-3,4-dihydro-4-oxonaphthalene--sulfonic acid chloride (also known as 1,2-naphthoquinone-(2)-diazo-4-sulfonic acid chloride or Diazo M) or 6-diazo-5,6-dihydro-5-oxonaphthalene-1-sulfonic acid chloride (also known as 1,2-napthaquinone-(2)-diazo-5-sulfonic acid chloride or Diazo L). These 4- and 5-ester groups or moieties respectively have the following chemical formulae (A) and (B):

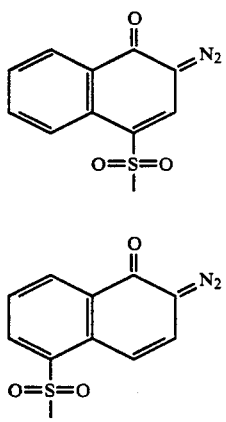

It is understood that the present invention covers the use of o-naphthoquinone diazide sulfonyl moieties singly or in mixtures in the condensation reaction with these triphenolcyclohexane compounds. Also, the present invention encompasses separate reactions of these triphenolcyclohexane compounds with different o-naphthoquinone diazide sulfonyl moieties followed by blending those reaction products together.

This condensation reaction may be carried under any conventional ester condensation conditions. Preferably, these ester compounds of formula (I), above, are prepared by first dissolving the sulfonic acid halide precursor, preferably, the sulfonic acid chloride, in a suitable solvent. Suitable solvents include acetone, dioxane, gamma-butyrolactone, methylene chloride, tetrahydrofurfural alcohol and the like. The phenolic derivatives of 4-(4-hydrophenyl) cyclohexanone is then added to this solution. It is advantageous to carry out this reaction in the presence of an acid-scavenging base, such as alkali metal carbonates or bicarbonates, alkaline earth metal carbonates or bicarbonates, tertiary aliphatic amines or pyridine or pyridine derivatives.

The esterification products of this reaction may be recovered from the reaction mixture by any conventional means, preferably by precipitation into acidified water, followed by filtration and drying.

The preferred photoactive compounds (sometimes known as "sensitizers") are those made from the preferred phenolic derivatives of 4-(4-hydroxyphenyl)cyclohexanone precursors mentioned above, namely, 1,1,4-tris(4-hydroxyphenyl) cyclohexanone. This preferred photoactive compound has formula (II) as follows:

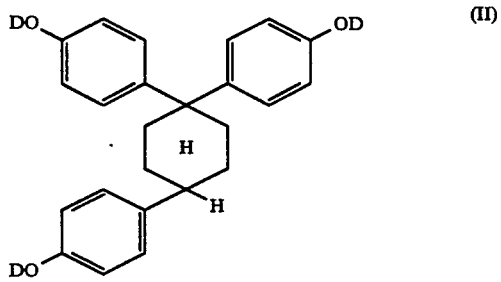

In these photoactive compounds, the D is most preferably 3-diazo-3,4-dihydro-4-oxonaphthalene-1-sulfonyl; 6-diazo-5,6-dihydro-5-oxonaphthalene-1-sulfonyl or hydrogen with the proviso that at least two of the D's are one or both of said sulfonyl moieties.

At least one of the ester compounds of the present invention may be mixed with an alkali-soluble resin or resins to make radiation sensitive mixtures which are useful as positive-working photoresist compositions. The term "alkali-soluble resin" is used herein to mean a resin which will dissolve completely in an aqueous alkaline developing solution conventionally used with positive-working photoresist compositions. Suitable alkali-soluble resins include phenol-formaldehyde novolak resins, cresol-formaldehyde novolak resins, and polyvinyl phenol resins, preferably having a molecular weight of about 500 to about 40,000, and more preferably from about 800 to 20,000. These novolak resins are preferably prepared by the condensation reaction of phenol or cresols with formaldehyde and are characterized by being light-stable, water-insoluble, alkali-soluble and film-forming. The most preferred class of novolak resins is formed by the condensation reaction between a mixture of meta- and para-cresols with formaldehyde having a molecular weight of about 1,000 to about 10,000. The preparation of examples of such suitable resins is disclosed in U.S. Pat. Nos. 4,377,631; 4,529,682; and 4,587,196, all which issued to Medhat Toukhy and are incorporated herein by references in their entireties or with U.S. patent application Ser. No. 07/713,891, which was filed by Charles Ebersole on Jun. 12, 1991.

Other photoactive compounds may also be added to the radiation sensitive mixtures of the Present invention. These other photoactive compounds may include o-quinonediazide esters derived from polyhydric phenols, alkyl-polyhydroxyphenones, arylpolyhydroxyphenones, and the like which can contain up to six or more sites for esterification. The most preferred o-quinonediazide esters are derived from 3-diazo-3,4-dihydro-4-oxonaphthalene--sulfonic acid chloride and 6-diazo-5,6-dihydro-5-oxonaphthalene-1-sulfonic acid chloride. When other photoactive compounds are used in radiation sensitive mixtures besides the photoactive compounds of the present invention, the amount of photoactive compounds of the present invention should be at least about 5% by weight, preferably 10-100% by weight of the total photoactive compounds present.

The proportion of the photoactive compound in the radiation sensitive mixture may preferably range from about 5 to about 30%, more preferably from about 8 to about 20% by weight of the nonvolatile (e.g., nonsolvent) content of the radiation sensitive mixture. The proportion of total binder resin of this present invention in the radiation sensitive mixture may preferably range from about 70 to about 95%, more preferably, from about 80 to 92% of the nonvolatile (e.g. excluding solvents) solids content of the radiation sensitive mixture.

These radiation sensitive mixtures may also contain conventional photoresist composition ingredients such as solvents, actinic and contrast dyes, anti-striation agents, plasticizers, speed enhancers, and the like. These additional ingredients may be added to the binder resin and photoactive compound before the solution is coated onto the substrate.

The resins and sensitizers may be dissolved in a solvent or solvents to facilitate their application to the substrate. Examples of suitable solvents include methoxyacetoxy propane, ethyl cellosolve acetate, n-butyl acetate, ethyl lactate, ethyl 3-ethoxy propionate, methyl-3-methoxypropionate propylene glycol alkyl ether acetates, or mixtures thereof and the like. Cosolvents such as xylene or n-butylacetate may also be used. The preferred amount of solvent may be from about 50% to about 500%, or higher, by weight, more preferably, from about 100% to about 400% by weight, based on combined resin and sensitizer weight.

Actinic dyes help provide increased resolution on highly reflective surfaces by inhibiting back scattering of light off the substrate. This back scattering causes the undesirable effect of optical notching, especially on a highly reflective substrate topography. Examples of actinic dyes include those that absorb light energy at approximately 400-460 nm [e.g Fat Brown B (C.I. No. 12010); Fat Brown RR (C.I. No. 11285); 2-hydroxy-1,4-naphthoquinone (C.I. No. 75480) and Quinoline Yellow A (C.I. No. 47000)] and those that absorb light energy at approximately 300-340 nm [e.g. 2,5-diphenyloxazole (PPO-Chem. Abs. Reg. No. 92-71-7) and 2-(4-biphenyl)-6-phenyl-benzoxazole (PBBO-Chem. Abs. Reg. No. 17064-47-0)]. The amount of actinic dyes may be up to ten percent weight levels, based on the combined weight of resin and sensitizer.

Contrast dyes enhance the visibility of the developed images and facilitate pattern alignment during manufacturing. Examples of contrast dye additives that may be used together with the radiation sensitive mixtures of the present invention include Solvent Red 24 (C.I. No. 26105), Basic Fuchsin (C.I. 42514), Oil Blue N (C.I. No. 61555) and Calco Red A (C.I. No. 26125) up to 10% weight levels, based on the combined weight of resin and sensitizer.

Anti-striation agents or leveling agents level out the resist coating or film to a uniform thickness. In other words, the leveling agent is used to eliminate the formation of striations on the surface of the resist coating once the coating is spun onto the substrate surface. Anti-striation agents may be used up to 5% weight levels, based on the weight of solids in the resist formulation. One suitable class of anti-striation agents is nonionic silicon-modified polymers. A preferred one is TROYKYD 366 made by Troy Chemical Co., Newark, N.J. Another suitable class of anti-striation agents is fluoroaliphatic polymeric ester surfactants. A preferred one is FC-430 FLUORAD made by 3M of St. Paul, Minn. Nonionic surfactants may also be used for this purpose, including, for example nonylphenoxy poly(ethyleneoxy) ethanol; octylphenoxy (ethyleneoxy) ethanol; and dinonyl phenoxy poly(ethyleneoxy) ethanol; polyoxyethylene lauryl ether; polyoxyethylene oleyl ether; polyoxyethylene octylphenyl ether; polyoxyethylene nonylphenyl ether; polyoxyethylene glycol dilaurate; and polyoxyethylene glycol distearate. Also may be useful are orgnosiloxane polymers and acrylic acid-containing or methacrylate acid-containing polymers.

Plasticizers improve the coating and adhesion properties of the photoresist composition and better allow for the application of a thin coating or film of photoresist which is smooth and of uniform thickness onto the substrate. Plasticizers which may be used include, for example, phosphoric acid tri-(B-chloroethyl)-ester; stearic acid; dicamphor; polypropylene; acetal resins; phenoxy resins; and alkyl resins up to ten percent weight levels, based on the combined weight of resin and sensitizer.

Speed enhancers tend to increase the solubility of the photoresist coating in both the exposed and unexposed areas, and thus, they are used in applications where speed of development is the overriding consideration even though some degree of contrast may be sacrificed, i.e., in positive resists while the exposed areas of the photoresist coating will be dissolved more quickly by the developer, the speed enhancers will also cause a larger loss of photoresist coating from the unexposed areas. Speed enhancers that may be used include, for example, picric acid, nicotinic acid or nitrocinnamic acid, as well as poly(monohydric)phenolic compounds at weight levels of up to 20%, based on the combined weight of resin and sensitizer.

The prepared radiation sensitive resist mixture, can be applied to a substrate by any conventional method used in the photoresist art, including dipping, spraying, whirling and spin coating. When spin coating, for example, the resist mixture can be adjusted as to the percentage of solids content in order to provide a coating of the desired thickness given the type of spinning equipment and spin speed utilized and the amount of time allowed for the spinning process. Suitable substrates include silicon, aluminum or polymeric resins, silicon dioxide, doped silicon dioxide, silicon resins, gallium arsenide, silicon nitride, tantalum, copper, polysilicon, ceramics and aluminum/copper mixtures. The coating surfaces of these substrates may or may not be primed with a conventional adhesion promoter (e.g. hexamethyldisilazane) before the photoresist coating is applied.

The photoresist coatings produced by the above described procedure are particularly suitable for application to silicon wafers coated with a silicon dioxide or silicon nitride layer such as are utilized in the production of microprocessors and other miniaturized integrated circuit components. An aluminum or aluminum-coated substrates may be used as well. The substrate may also comprise various polymeric resins especially transparent polymers such as polyesters and polyolefins.

After the resist solution is coated onto the substrate, the coated substrate is baked at approximately 70° C. to 125° C. until substantially all the solvent has evaporated and only a uniform radiation sensitive coating remains on the substrate.

The coated substrate can then be exposed to radiation, especially ultraviolet radiation, in any desired exposure pattern, produced by use of suitable masks, negatives, stencils, templates, and the like. Conventional imaging process or apparatus currently used in processing photoresist-coated substrates may be employed with the present invention. While ultraviolet (UV) light is the preferred source of radiation, other sources of radiation such as visible light, electron or ion beam and X-ray radiant energy may be used instead.

The exposed resist-coated substrates are preferably subjected to a post exposure bake at a temperature from about 100° C. to about 130° C. from about 30-300 seconds to enhance image quality and resolution.

The exposed resist-coated substrates are next developed in an aqueous alkaline solution. This solution is preferably agitated, for example, by nitrogen gas. Examples of aqueous alkaline developers include aqueous solutions of tetramethylammonium hydroxide, sodium hydroxide, potassium hydroxide, ethanolamine, choline, sodium phosphates, sodium carbonate, sodium metasilicate, and the like. The preferred developers for this invention are aqueous solutions of either alkali metal hydroxides, phosphates or silicates, or mixtures thereof, or tetramethylammonium hydroxide.

Alternative development techniques such as spray development or puddle development, or combinations thereof, may also be used.

The substrates are allowed to remain in the developer until all of the resist coating has dissolved from the exposed areas. Normally, development times from about 10 seconds to about 3 minutes are employed.

After selective dissolution of the coated wafers in the developing solution, they are preferably subjected to a deionized water rinse to fully remove the developer or any remaining undesired portions of the coating and to stop further development. This rinsing operation (which is part of the development process) may be followed by blow drying with filtered air to remove excess water. A post-development heat treatment or bake may then be employed to increase the coating's adhesion and chemical resistance to etching solutions and other substances. The post-development heat treatment can comprise the baking of the coating and substrate below the coating's thermal deformation temperature.

In industrial applications, particularly in the manufacture of microcircuitry units on silicon/silicon dioxide-type substrates, the developed substrates may then be treated with a buffered hydrofluoric acid etching solution or plasma gas etch. The resist compositions of the present invention are believed to be resistant to a wide variety of acid etching solutions or plasma gases and provide effective protection for the resist-coated areas of the substrate.

Later, the remaining areas of the photoresist coating may be removed from the etched substrate surface by conventional photoresist stripping operations.

The present invention is further described in detail by means of the following Examples. All parts and percentages are by weight unless explicitly stated otherwise.

EXAMPLE 1

Preparation of 1,1,1-tris(4-hydroxyphenyl)cyclohexanone

The reaction was conducted in a 500 mL three-neck round bottom flask fitted with a mechanical stirring apparatus, a thermometer, and a reflux condenser.

The 4-(4-hydroxyphenyl)cyclohexanone (40.0 g, 0.2102 mole) and molten phenol (158.4 g, 1.68 mole) were added to the flask. The flask and contents were placed in a 45°-50° oil bath and stirring was begin. The methane sulfonic acid (96.10 g, 0.631 mole) was added to the reaction flask which caused the internal reaction temperature to rise to 60° C. The flask and contents were allowed to stir 3 hours in the heated oil bath and allowed to cool to room temperature.

The contents of the flask were poured into 1,500 mL of 50°-60° C. water with stirring and allowed to stir for 15 minutes. The water layer was decanted and the gummy mass was treated once more with hot water in the above manner. The product mass was removed from the reaction flask.

The solid was triturated under water and isolated by filtration. It was dissolved in 200 mL methanol and precipitated into 3,000 mL of deionized water and isolated by filtration. The product was dried to constant weight under high vacuum at 60° C., weight 45 g (61.7%).

EXAMPLE 2

Esterification of the product of Example 1 with 1.8 Moles of 6-Diazo-5,6-dihydro-5-oxonaphthalene-1-Sulfonic Acid Chloride (1.8 TPCH)

The reaction was conducted in a one liter amber three-neck flask fitted with a mechanical stirring apparatus, pressure equalizing addition funnel, and a thermometer.

The tris 1,1,4-(4-hydroxyphenyl)cyclohexane (10.93 g, 0.03 mole) and 6-diazo-5,6-dihydro-5-oxonaphthalene-1-sulfonic acid chloride (14.51 g, 0.0540 mole) and 350 mL of gamma-butyrolactone were added to the flask. The stirring was begun and after the substrate had dissolved, a solution of triethylamine (6.01 g, 0.0594 mole) and acetone (18 mL) was added over 13 minutes. The reaction temperature rose to 22° C. from 18° C. during addition. The solution was allowed to stir one hour at room temperature after addition was completed.

The reaction solution was poured into a stirred solution of 2,000 mL deionized water and 15 g acetic acid. The yellow precipitate was isolated by filtration and reslurried in 2L of deionized water. The solid was isolated by filtration and washed with 2L of deionized water. The yellow presscake was protected from light and dried at atmospheric pressure and ambient temperature and high vacuum at 40° C., weight 21.6 g.

The yellow solid was subjected to HPLC assay using phosphate buffer and acetonitrile according to the following program; elution with 50/50 phosphate buffer acetonitrile for one minute. Change to 30/70 buffer acetonitrile in a linear manner over 25 minutes, and elution for 22 minutes with the 30/70 mixture. The column is a 3 micron 5×150 mm Supelcosil C-18 system with a flow rate of 1 mL/min. Reported are the retention time and (area percent) for all peaks two area percent or greater: 12.3 (2.5); 17.8 (9.1); 22.6 (5.4); 23.1 (5.3) 28.5 (2.1); 32.2 (14.5); 34.6 (25.3); 35.2 (3.9); 40.5 (2.3); 42.6 (2.0).

EXAMPLE 3

Esterification of the Product of Example 1 with 2.25 Moles of 6-Diazo-5,6-dihydro-5-oxonaphthalene-1-Sulfonic Acid Chloride (2.25 TPCH)

The reaction was performed in a one liter three-neck amber flask fitted with a pressure equalizing addition funnel, thermometer, and mechanical stirring apparatus.

The tris 1,1,4-(4-hydroxyphenyl)cyclohexane (10.93 g, 0.03 mole) and 6-diazo-5,6-dihydro-5-oxonaphthalene-1-sulfonic acid chloride (18.14 g, 0.0675 moles) were added to the flask followed by 400 mL of gamma-butyrolactone and stirring was begin. After the solids had completely dissolved, a solution of triethylamine (7.51 g, 0.0742 mole) in acetone (22 mL) was added to the solution over 13 minutes. During addition, the temperature rose to 27° C. from 20° C. After addition was completed, the solution was allowed to stir for one hour at ambient temperature.

The hazy mixture was poured into a stirred solution of 2,200 mL deionized water and 18 g acetic acid which produced a yellow precipitate. The precipitate was isolated by filtration and reslurried in 2 L of deionized water for about 30 minutes. The solid was isolated by filtration, and it was washed in portions with 2 L of deionized water. The yellow solid was protected from light and dried at atmospheric pressure at ambient temperature and high vacuum at 40° C., weight 26.4 g.

A sample of the solid was subjected to HPLC assay as described in the previous example and the retention time and (area percent) of the peaks greater than two area percent are reported; 17.8 (7.0); 22.56 (2.8); 23.0 (2.7); 32.21 (20.6); 37.3 (34.6); 35.22 (6.2).

EXAMPLE 4

20% PAC, 1.8 TPCH, 16% Speed Enhancer 9.1 Grams of an STN novolak (having a dissolution time of 300 seconds/micron in 0.262N aqueous developer of tetramethylammonium hydroxide (TMAH)) were dissolved in 36.61 g of methyl-3-methoxypropionate (MMP). 2.71 Grams of TPCH PAC esterified at a ratio of 1.8 to 1 and 1.73 g of 1,3,3,5-tetrakis(4-hydroxyphenyl) pentane speed enhancer were dissolved in the novolak solution. 0.015 Grams of a leveling agent known commercially as FC-430 were added to this resist. The resist solution was microfiltered through 0.2 um pore size filter to remove any particulate contamination. The final solids content of the resist is 27%.

The STN novolak was prepared by condensing a mixture of substituted phenols with formaldehyde according to general procedure set forth in U.S. patent application Ser. No. 07/713,891 filed by Charles E. Ebersole on Jun. 19, 1991. The phenolic composition of this novolak is 20% p-cresol (as dimers), 50% 2,3-dimethylphenol, 20% 2,3,5-trimethylphenol, 8% 2,6-dimethylphenol, and 2% o-cresol.

EXAMPLE 5

18% PAC, 1.8 TPCH, 16% Speed Enhancer 9.3 Grams of the same novolak STN (having a dissolution time of 300 seconds/micron in 0.262N aqueous developer of tetramethylammoniumhydroxide (TMAH)) were dissolved in 36.5 g of methyl-3-methoxypropionate (MMP). 2.43 Grams of the TPCH PAC esterified at a ratio of 1.8 to 1 and 1.77 g of 1,3,3,5-tetrakis(4-hydroxyphenyl)-pentane speed enhancer were dissolved in the novolak solution. 0.015 Grams of the FC-430 leveling agent was added to this resist. The resist solution was microfiltered through 0.2 um pore size filter to remove any particulate contamination. The final solids content of the resist is 27%.

EXAMPLE 6

20% PAC, 1.8 TPCH, 18% Speed Enhancer 8.86 Grams of the same STN novolak were dissolved in 36.5 g of methyl-3-methoxypropionate (MMP). 2.7 Grams of the TPCH PAC esterified at a ratio of 1.8 to 1 and 1.944 g of 1,3,3,5-tetrakis(4-hydroxyphenyl) pentane speed enhancer were dissolved in the novolak solution. 0.015 Grams of the FC-430 leveling agent were added to this resist. The resist solution was microfiltered through 0.2 um pore size filter to remove any particulate contamination. The final solids content of the resist is 27%.

EXAMPLE 7

20% PAC, 2.25 TPCH, 16% Speed Enhancer 8.3 Grams of the same STN novolak were dissolved in 36.5 g of methyl-3-methoxypropionate. 2.47 Grams of the TPCH PAC esterified at a ratio of 2.25 to 1 and 1.58 g of 1,3,3,5-tetrakis(4-hydroxyphenyl) pentane speed enhancer were dissolved in the novolak solution. 0.0137 Grams of the FC-430 leveling agent were added to this resist. The resist solution was microfiltered through 0.2 um pore size filter to remove any particulate contamination. The final solids content of the resist is 27%.

EXAMPLE 8

16% PAC, 2.25 TPCH, 16% Speed Enhancer 9.53 Grams of the same STN novolak were dissolved in 36.5 g of methyl-3-methoxypropionate (MMP). 2.16 Grams of TPCH PAC esterified at a ratio of 2.25 to 1 and 1.81 g of 1,3,3,5-tetrakis(4-hydroxyphenyl) pentane speed enhancer were dissolved in the novolak solution. 0.015 Grams of the FC-430 leveling agent were added to this resist. The resist solution was microfiltered through 0.2 um pore size filter to remove any particulate contamination. The final solids content of the resist is 27%.

EXAMPLE 9

18% PAC, 2.25 TPCH, 20% Speed Enhancer 8.856 Grams of the same STN novolak were dissolved in 36.5 g of methyl-3-methoxypropionate (MMP). 2.43 Grams of TPCH PAC esterified at a ratio of 2.25 to 1 and 2.214 g of 1,3,3,5-tetrakis(4-hydroxyphenyl) pentane speed enhancer were dissolved in the novolak solution. 0.015 Grams of the FC-430 leveling agent were added to this resist. The resist solution was microfiltered through 0.2 um pore size filter to remove any particulate contamination. The final solids content of the resist is 27%.

EXAMPLE 10

20% PAC, 1.8 TPCM, 20% Speed Enhancer 8.64 Grams of the same STN novolak were dissolved in 36.4852 grams methyl-3-methoxypropionate (MMP). 2.7 Grams of the TPCH PAC esterified at the ratio of 1.8 to 1 and 2.16 g of 1,3,3,5-tetrakis(4-hydroxyphenyl) pentane were dissolved in the novolak solution. 0.015 Grams of the FC-430 leveling agent were added to this resist. The resist solution was microfiltered through 0.2 um pore size filter to remove any particulate contamination. The final solids content of the resist is 27%.

COMPARATIVE EXAMPLE 1

20% PAC, 17% Speed Enhancer 8.964 Grams of the same STN novolak were dissolved in 36.5 g of methyl-3-methoxypropionate (MMP). 0.54 Grams of a 3-TPM PAC esterified at a ratio of 2.6 to 1, and 2.16 g of 4-TPM PAC esterified at a ratio of 2.8 to 1, and 1.836 g of 1,3,3,5-tetrakis(4-hydroxyphenyl)-pentane speed enhancer were dissolved in the novolak solution. 0.015 Grams of the FC-430 leveling agent were added to this resist. The resist solution was microfiltered through 0.2 um pore size filter to remove any particulate contaminants. The final solids content of the resist is 27%.

The 3-TPM PAC is the product of esterifying about 2.6 moles of 2,1-diazonaphthoquinone-5-sulfonyl chloride (DNQ) with one mole of bis-[3,5-dimethyl-4-hydroxyphenyl]-3-methoxy-4-hydroxyphenyl methane. The 4-TPM PAC is the product of esterifying about 2.24 moles of DNQ with one mole of bis-[3,5-dimethyl-4-hydroxyphenyl]-3,4-dihydroxyphenyl methane.

COMPARATIVE EXAMPLE 2

20% PAC, 18.5% Speed Enhancer 8.8 Grams of the same STN novolak were dissolved in 36.5 grams of methyl-3-methoxypropionate (MMP). 1.35 Grams of 3-TPM PAC and 1.35 g of the 4-TPM PAC ester, and 1.998 g of 1,3,3,5-tetrakis(4-hydroxyphenyl)-pentane speed enhancer were dissolved in the novolak solution. 0.015 Grams of the FC-430 leveling agent were added to this resist. The resist solution was microfiltered through 0.2 um pore size filter to remove any particulate contaminants. The final solids content of the resist is 27%.

COMPARATIVE EXAMPLE 3

16% PAC, 10% Speed Enhancer 10.21 Grams of the same STN novolak were dissolved in 36.5 grams of methyl-3-methoxypropionate (MMP). 0.432 Grams of the 4-TPM PAC and 1.728 g of the 3-TPM PAC, and 1.134 g of 1,3,3,5-tetrakis(4-hydroxyphenyl)-pentane speed enhancer were dissolved in the novolak solution. 0.015 Grams of the FC-430 leveling agent were added to this resist. The resist solution was microfiltered through 0.2 um pore size filter to remove any particulate contaminants. The final solids content of the resist is 27%.

COMPARATIVE EXAMPLE 4

22% PAC, 20% Speed Enhancer 8.42 Grams of the same STN novolak were dissolved in 36.5 g of methyl-3-methoxypropionate (MMP). 0.594 Grams of the 4-TPM PAC and 2.376 g of the 3-TPM PAC, and 2.1 g of 1,3,3,5-tetrakis(4-hydroxyphenyl)-pentane speed enhancer were dissolved in the novolak solution. 0.015 Grams of the FC-430 leveling agent were added to this resist. The resist solution was microfiltered through 0.2 um pore size filter to remove any particulate contaminants. The final solids content of the resist is 27%.

RESIST PROCESSING

Resist samples were spin coated on 4" silicon wafers and soft baked at 90° C. for one minute. The spin speed of the spinner was adjusted for each sample to produce equal resist film thickness of 0.99 um. The resist coatings were exposed to i-line radiation of different energies using a Cannon 0.52NA i-line Stepper Model No. FPA-2000iI. Post exposure bake was carried out at 120° C. for one minute. An SVG track developer unit was used to develop the resist using 0.262N aqueous TMAH developer for 60 seconds followed by D.I. water rinse.

RESIST CONTRAST TEST

This preliminary test was used to characterize and compare resist performances. In this test, the resist was exposed to 50 different exposure energies ranging from 20 to 161 mJ/Cm$^2$. After development, each area of different exposure is measured for remaining resist film thickness using prometrix optical measuring unit. The resist contrast is the slope of the line connecting all the points relating log dose and normalized remaining film thickness. The higher the slope, the higher the resist contrast.

| Resist | Results Contrast | Eo mJ/Cm$^2$ |
|---|---|---|
| Example 4 | 5.8 | 144 |
| Example 5 | 6.1 | 146 |
| Example 6 | 6.7 | 120 |
| Example 7 | Did not develop, too slow | |
| Example 8 | 4.6 | 165 |
| Example 9 | 5.4 | 165 |
| Example 10 | 4.3 | 128 |
| Comparative Examples | | |
| 1 | 3.7 | 86 |
| 2 | 4.3 | 110 |
| 3 | 1.73 | 101 |
| 4 | 3.54 | 129 |

LITHOGRAPHIC RESULTS

The lithographic results for resist Examples 5, 6, and 10 are shown in Table 1.

TABLE 1

| Example | % PAC | % SE | Gamma | Eo | Resolution | DOF* | $E_{opt}$ |
|---|---|---|---|---|---|---|---|
| 5 | 18 | 16 | 6.10 | 146 | 0.40 | 1.5 | 290 |
| 6 | 20 | 18 | 6.70 | 120 | 0.37 | 2.1 | 270 |
| 10 | 20 | 20 | 4.30 | 128 | 0.40 | 2.1 | 240 |
| C-1 | 20 | 17 | 3.7 | 86 | 0.36 | 1.8 | 190 |
| C-2 | 20 | 18.5 | 4.3 | 110 | 0.39 | 1.6 | 220 |
| C-3 | 16 | 10 | 1.73 | 101 | 0.55 | 0 | 130 |
| C-4 | 22 | 20 | 3.54 | 129 | 0.45 | 0.7 | 280 |

*For 0.5 micron line/space features.

The resists of the present invention exhibit high contrast performance, good resolution, and high defocus performance as shown above. In particular, the resists of the present invention showed particularly high gamma values.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A radiation sensitive mixture comprising an alkali-soluble binder resin and at least one photoactive compound comprising a compound of formula (I):

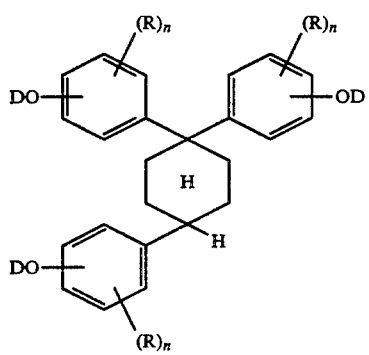

wherein each R is individually selected from hydrogen and a lower alkyl group having 1 to 4 carbon atoms; n is either 0, 1, or 2; and D is selected from the group consisting of hydrogen or o-naphthoquinone diazide sulfonyl group; with the proviso that at least two D's are o-naphthoquinone diazide sulfonyl groups, and wherein the amount of said binder resin is about 70 to 95% by weight and the amount of photoactive compound is from about 5 to about 30% by weight, based on the total solids content of said radiation-sensitive mixture.

2. The radiation sensitive mixture of claim 1 wherein said photoactive compound has formula (II).

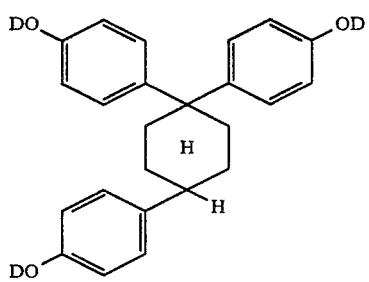

3. The radiation sensitive mixture of claim 1 wherein said photoactive compound is present in the amount of about 8% to about 20% by weight, based on the total solids content of said radiation sensitive mixture and said binder resin is present in the amount of about 80% to about 92% by weight, based on the total solids content of said radiation sensitive mixture.

4. The radiation sensitive mixture of claim 1 wherein said D is 3-diazo-3,4-dihydro-4-oxonaphthalene-1-sulfonyl; 6-diazo-5,6-dihydro-5-oxonaphthalene-1-sulfonyl or hydrogen.

5. The radiation sensitive mixtures of claim 1 further comprising at least one substance selected from solvents, actinic and visual contrast dyes, plasticizers, antistriation agents and speed enhancers.

6. A coated substrate comprising a substrate coated with a film of a radiation sensitive mixture comprising an admixture of at least one alkali-soluble binder resin compound and at least one photoactive compound of formula (I):

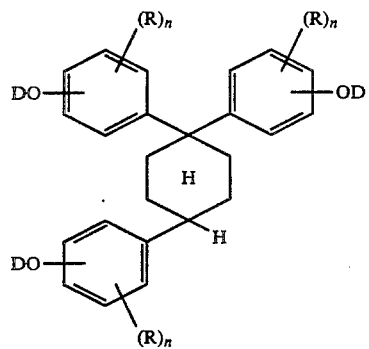

wherein each R is individually selected from hydrogen and a lower alkyl group having 1 to 4 carbon atoms; n is either 0, 1, or 2; and D is selected from the group consisting of hydrogen or o-naphthoquinone diazide sulfonyl group; with the proviso that at least two D's are o-naphthoquinone diazide sulfonyl groups; and wherein the amount of said binder resin is about 70% to 95% by weight and the amount of photoactive compound is from about 5% to about 30% by weight, based on the total solids content of said radiation sensitive mixture.

7. The coated substrate of claim 6 wherein said substrate comprises one or more compounds selected from the group consisting of polyester, polyolefin, silicon, gallium arsenide, silicon/silicon dioxide, doped silicon dioxide, silicon nitride, aluminum/copper mixtures, tantalum, copper and polysilicon.

8. The coated substrate of claim 6 wherein said substrate is a silicon wafer coated with silicon dioxide.

9. A photoactive compound of formula (I):

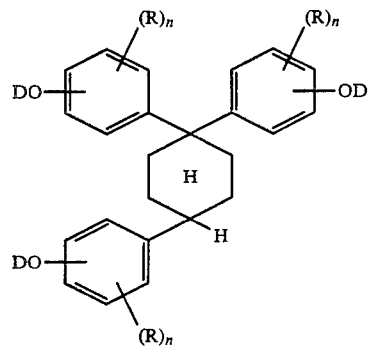

wherein each R is individually selected from hydrogen and a lower alkyl group having 1 to 4 carbon atoms; n is either 0, 1, or 2; and D is selected from the group consisting of hydrogen or o-naphthoquinone diazide sulfonyl group; with the proviso that at least two D's are o-naphthoquinone diazide sulfonyl groups.

10. The photoactive compound of claim 9 having formula (II):

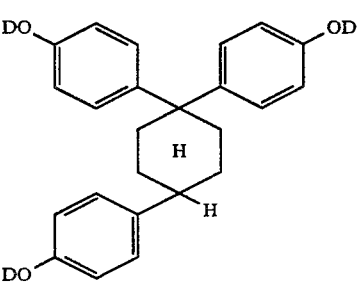

* * * * *